(12) United States Patent
Pan

(10) Patent No.: US 11,929,117 B2
(45) Date of Patent: Mar. 12, 2024

(54) PHASE-CHANGE MEMORY DEVICES, SYSTEMS, AND METHODS OF OPERATING THEREOF

(71) Applicant: YANGTZE MEMORY TECHNOLOGIES CO., LTD., Wuhan (CN)

(72) Inventor: Xuwen Pan, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 296 days.

(21) Appl. No.: 17/384,143

(22) Filed: Jul. 23, 2021

(65) Prior Publication Data
US 2023/0005534 A1    Jan. 5, 2023

Related U.S. Application Data

(63) Continuation of application No. PCT/CN2021/103403, filed on Jun. 30, 2021.

(51) Int. Cl.
| | | |
|---|---|---|
| G11C 11/00 | (2006.01) | |
| G11C 11/412 | (2006.01) | |
| G11C 13/00 | (2006.01) | |
| G11C 14/00 | (2006.01) | |
| H10B 10/00 | (2023.01) | |
| H10N 70/00 | (2023.01) | |
| H10N 70/20 | (2023.01) | |

(52) U.S. Cl.
CPC ........ *G11C 13/0004* (2013.01); *G11C 11/412* (2013.01); *G11C 13/004* (2013.01); *G11C 14/009* (2013.01); *H10B 10/12* (2023.02); *H10N 70/231* (2023.02); *H10N 70/826* (2023.02)

(58) Field of Classification Search
CPC .............. G11C 13/0004; G11C 11/412; H10N 70/826; H10N 70/231
USPC ........................................................ 365/154
See application file for complete search history.

(56) References Cited

U.S. PATENT DOCUMENTS

| | | | | |
|---|---|---|---|---|
| 9,218,875 B2* | 12/2015 | Hong | ................... | H10N 70/231 |
| 9,715,916 B1* | 7/2017 | Tomishima | ......... | G11C 11/1657 |
| 2006/0197115 A1 | 9/2006 | Toda | | |
| 2007/0236987 A1 | 10/2007 | Cho et al. | | |

(Continued)

FOREIGN PATENT DOCUMENTS

| | | |
|---|---|---|
| CN | 110192269 A | 8/2019 |
| CN | 110335636 A | 10/2019 |

(Continued)

OTHER PUBLICATIONS

International Search Report issued in corresponding International Application No. PCT/CN2021/103403, dated Apr. 7, 2022, 4 pages.

*Primary Examiner* — Vu A Le
(74) *Attorney, Agent, or Firm* — BAYES PLLC

(57) ABSTRACT

In certain aspects, a memory device includes a bit line, a plurality of memory cells coupled with the bit line, and N selectors, where N is a positive integer greater than 1, and N word lines. Each one of the plurality of memory cells includes N phase-change memory (PCM) elements. Each one of the N selectors is coupled with a respective one of the N PCM elements. Each one of the N word lines is coupled with a respective one of the N selectors.

17 Claims, 11 Drawing Sheets

(56) References Cited

U.S. PATENT DOCUMENTS

| | | | |
|---|---|---|---|
| 2010/0258776 A1* | 10/2010 | Li | H10N 70/8413 |
| | | | 438/102 |
| 2011/0211390 A1 | 9/2011 | Hanzawa et al. | |
| 2018/0315474 A1 | 11/2018 | Radaelli et al. | |
| 2019/0244666 A1* | 8/2019 | Hsu | G11C 14/009 |
| 2021/0111341 A1 | 4/2021 | Liu | |
| 2021/0111342 A1 | 4/2021 | Liu | |
| 2021/0111343 A1 | 4/2021 | Jiang et al. | |

FOREIGN PATENT DOCUMENTS

| | | |
|---|---|---|
| CN | 110910931 A | 3/2020 |
| CN | 101359502 A | 12/2020 |
| JP | 2013127829 A | 6/2013 |

* cited by examiner

370

400

| Failure | Extremely high resistance | F |
|---|---|---|
| Amorphous state | High resistance | Logic 0 |
| Crystalline state | Low resistance | Logic 1 |

FIG. 8A

|  | H0 | H1 | Voltage difference |
|---|---|---|---|
| First readout | 1, Low | 0, High | Negative |
| Second readout | 0, High | 1, Low | Positive |

FIG. 8B

|  | H0 | H1 | Voltage difference |
|---|---|---|---|
| First readout | 1, Low | F, Extremely high resistance | Negative |
| Second readout | 0, High | F, Extremely high resistance | Negative |

FIG. 8C

PHASE-CHANGE MEMORY DEVICES, SYSTEMS, AND METHODS OF OPERATING THEREOF

CROSS-REFERENCE TO RELATED APPLICATIONS

This application is continuation of International Application No. PCT/CN2021/103403, filed on Jun. 30, 2021, entitled "PHASE-CHANGE MEMORY DEVICES, SYSTEMS, AND METHODS OF OPERATING THEREOF," which is hereby incorporated by reference in its entirety.

BACKGROUND

The present disclosure relates to phase-change memory devices, systems, and methods of operating thereof.

Dynamic Random-Access Memory (DRAM) is a memory device used in a computer in which information is stored and from which it is retrieved. Each DRAM cell includes a transistor and a capacitor within an integrated circuit, and a data bit is stored in the capacitor.

Phase-change memory (PCM) is another memory device that is capable of changing resistance upon sufficient electrical or thermal stimulations, which have attracted significant attention for high-speed nonvolatile memory applications. Specifically, PCM can utilize the difference between the resistivity of the amorphous and the crystalline phase in phase-change materials based on the heating of the phase-change materials electrothermally.

SUMMARY

In one aspect, a memory device includes a bit line, a plurality of memory cells coupled with the bit line, and N selectors, where N is a positive integer greater than 1, and N word lines. Each one of the plurality of memory cells includes N phase-change memory (PCM) elements. Each one of the N selectors is coupled with a respective one of the N PCM elements. Each one of the N word lines is coupled with a respective one of the N selectors.

In another aspect of the present disclosure, a memory device includes a bit line, a plurality of memory cells coupled with the bit line, each one of the plurality of memory cells includes a common phase-change memory (PCM) element and two selectors coupled with the common PCM element, and two word lines. Each one of the two word lines is coupled with each one of the two selectors.

In still another aspect of the present disclosure, a system includes a memory device and a memory controller. The memory device includes a bit line, a plurality of memory cells coupled with the bit line, each one of the plurality of memory cells includes N phase-change memory (PCM) elements, and N selectors, where N is a positive integer greater than 1. Each of the N selectors is coupled with a respective one of the N PCM elements and N word lines. Each one of the N word lines is coupled with a respective one of the N selectors. The memory controller is coupled to the memory device and configured to control the plurality of memory cells through the bit line and the N word lines.

In yet still another aspect of the present disclosure, a method of operating a memory device is disclosed. The memory device includes a plurality of memory cells, and N word lines. Each one of the plurality of memory cells includes N phase-change memory (PCM) elements, and N selectors, where N is a positive integer greater than 1. Each one of the N selectors is coupled with a respective one of the N PCM elements. Each one of the N word lines is coupled with a respective one of the N selectors. The method includes inputting data into each one of the plurality of memory cells to generate N signals from the N word lines; and before the N signals stabilize, comparing each two of the N signals read from the N word lines to output a bit of a comparing result.

In yet still another aspect of the present disclosure, a method of operating a memory device is disclosed. The memory device includes a plurality of memory cells, a first word line, and a second word line. Each one of the plurality of memory cells includes a first phase-change memory (PCM) element, a second PCM element, a first selector, and a second selector. The first selector and the second selector are coupled with a first PCM element and a second PCM element, respectively. The first word line and the second word line are coupled with the first selector and the second selector, respectively. The method includes programming the first selector as 0 and the second selector as 1, reading the first PCM element and the second PCM element to generate a first voltage difference of the first PCM element and the second PCM element, programming the first selector as 1 and the second selector as 0, reading the first PCM element and the second PCM element to generate a second voltage difference of the first PCM element and the second PCM element, in response to determining that the first voltage difference and the second voltage difference are same as positive or negative, determining that at least one of the first PCM element and the second PCM element is failed, and in response to determining that the first voltage difference and the second voltage difference are different as positive or negative, determining that one of the first PCM element and the second PCM element is well-functioned.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 8A-8C illustrate tables of readout voltages of different resistance states and their corresponding voltage differences of an exemplary method of operating a memory device according to some aspects of the present disclosure.

Figure 1:
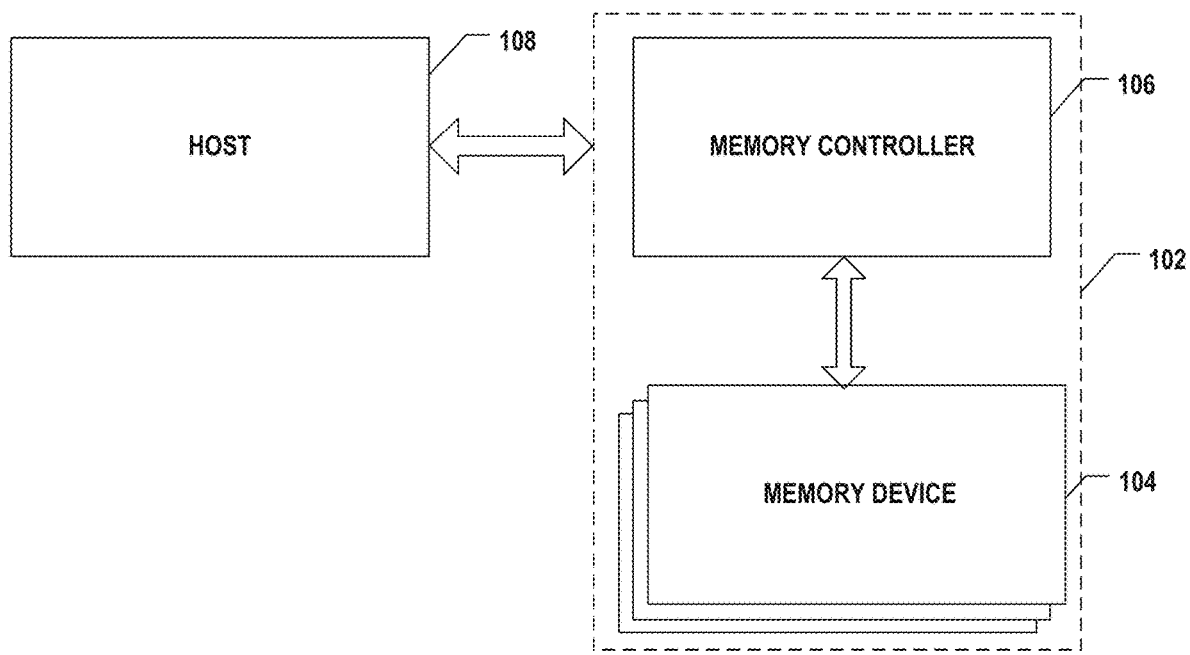
FIG. 1 illustrates a block diagram of an exemplary system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductor and contact layers (in which interconnect lines and/or via contacts are formed) and one or more dielectric layers.

Each DRAM cell includes a transistor and a capacitor within an integrated circuit, and a data bit is stored in the capacitor. Since transistors always leak a small amount of charge, the capacitors will slowly discharge, causing information stored in them to drain. As such, DRAM has to be refreshed to retain data. The advantages of DRAM are its simple design and low cost in comparison to alternative types of memory. Also, DRAM can achieve a 10 ns read and write speed. However, DRAM may also lose data easily due to charge leakage in DRAM cells.

A PCM can utilize the difference between the resistivity of the amorphous and the crystalline phase in phase-change materials (e.g., chalcogenide alloys) based on heating and quenching of the phase-change materials electrothermally. The phase-change material in a PCM cell can be located between two electrodes, and electrical currents can be applied to switch the material (or at least a fraction of it that blocks the current path) repeatedly between the two phases to store data. By changing the resistance rapidly, PCM can achieve a faster read and write speed than that of DRAM up to a 10 ns to 100 ns read and write speed. However, the performance of PCM cells is largely influenced by the elemental compositions. Different alloys may have distinctly different physical and electrical properties in terms of crystallization speed, thermal stability, switching power, and resistance contrast. A conventional approach to defining the low resistance state (e.g., ON state) as memory state "1" and the high resistance state (e.g., OFF state) as memory state "0" of a memory device may not be able to fulfill the need in defining the 1 or 0 state of PCM cells due to the high cell-to-cell variation. For example, the first memory state "0" can correspond to the first range of voltages, and the second memory state "1" can correspond to the second range of voltages. However, in the case of PCM, the range of voltages may not be easily defined because the resistance of the PCM cell may be fluctuant, and the range of voltages may be wide. Therefore, other approaches to defining the multiple memory states of a memory cell may be helpful, especially for PCM cells.

Furthermore, in a cost-benefit sensitive market like solid-state drive (SSD), the pursuit of cheaper and larger SSD products has pushed the industries to store more bits on a single cell. In general, the number of bits stored on a cell determines the type of memory used. A single-level cell (SLC) memory contains one bit per cell. Multi-level cell (MLC) doubles the capacity with two bits per cell. Triplelevel cell (TLC) contains three bits per cell, while quad-level cell (QLC) contains four bits per cell, allowing for four times the capacity of SLC memory. While it is not that more bits saved on a single cell equal better memory product due to other write performance issues and endurance challenges, it is generally better to have multiple approaches to realize multiple states in a single memory cell to increase the potential and flexibility of the products.

Last, among other memory devices, PCM has faced data retention challenges due to its thermal stability between the amorphous and the crystalline phase. A failed PCM cell may not be able to write back to the 0 state represented by the high-resistance state and may be read into 1 state represented by the low-resistance state, which causes data error. These error bits may need to be identified before the problem becomes catastrophic.

To address one or more of the aforementioned issues, the present disclosure introduces a novel architecture of PCM memory devices. Each memory cell of the PCM memory device can include N PCM elements, N selectors, and N word lines (N is a positive integer greater than 1, e.g., 2, 3, 4, etc.) arranged in a differential architecture, which can allow higher speed, high accuracy read and write operations, as well as the instant determination of any device failure. The number of data bits that can be stored in each memory cell can be increased, for example, from MLC to QLC, as well due to the differential architecture. In some implementations, each one of the memory cells further includes an SRAM for output data comparison and high-speed data cache.

FIG. 1 illustrates a block diagram of an exemplary system SRAM 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure, including a PCM memory device, a PCM memory device with a Static Random-Access Memory (SRAM) cache, or a PCM memory device with a comparator circuit in accordance with various aspects of the present disclosure, as described below in detail. In some implementations, memory device 104 may include a PCM memory device including a bit line extending laterally in the x-y plane, one or more memory cells coupled with a bit line. Each memory cell includes N PCM elements, and N selectors coupled with a respective PCM element, where N is a positive integer greater than 1. The PCM memory device may also include N word lines extending laterally in the x-y plane. Each word line is coupled with a respective selector. Memory controller 106 is configured to control the plurality of memory cells through the bit line and the N word lines.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is configured to include a comparator circuit which is configured to compare two voltage signals and output either a 1 (the voltage at the positive side) or a 0 (the voltage at the negative side) to indicate which is larger. The output results 1 and 0 of the comparator circuit can be stored as a bit for data per memory cell. In some implementations, memory controller 106 is designed for operating in a low duty-cycle environment like secure digital (SD) cards, compact flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations by sending instructions, such as read instruction, erase instruction, and program instruction, to memory device 104. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104.

Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 106 and one or more memory devices 104 can be integrated into various types of storage devices, for example, being included in the same package, such as a universal flash storage (UFS) package or an eMMC package. That is, memory system 102 can be implemented and packaged into different types of end electronic products.

PCM cells can be included in a cross-point (XPoint) device to form a PCM XPoint memory device to store data therein. PCM cells can also be vertically stacked in three-dimension (3D) to form a 3D PCM memory device. In an XPoint circuit architecture, which stores data based on a change in resistance of the bulk material property (e.g., in a high-resistance state or a low-resistance state), in conjunction with a stackable XPoint data access array to be bit-addressable.

Figure 2:
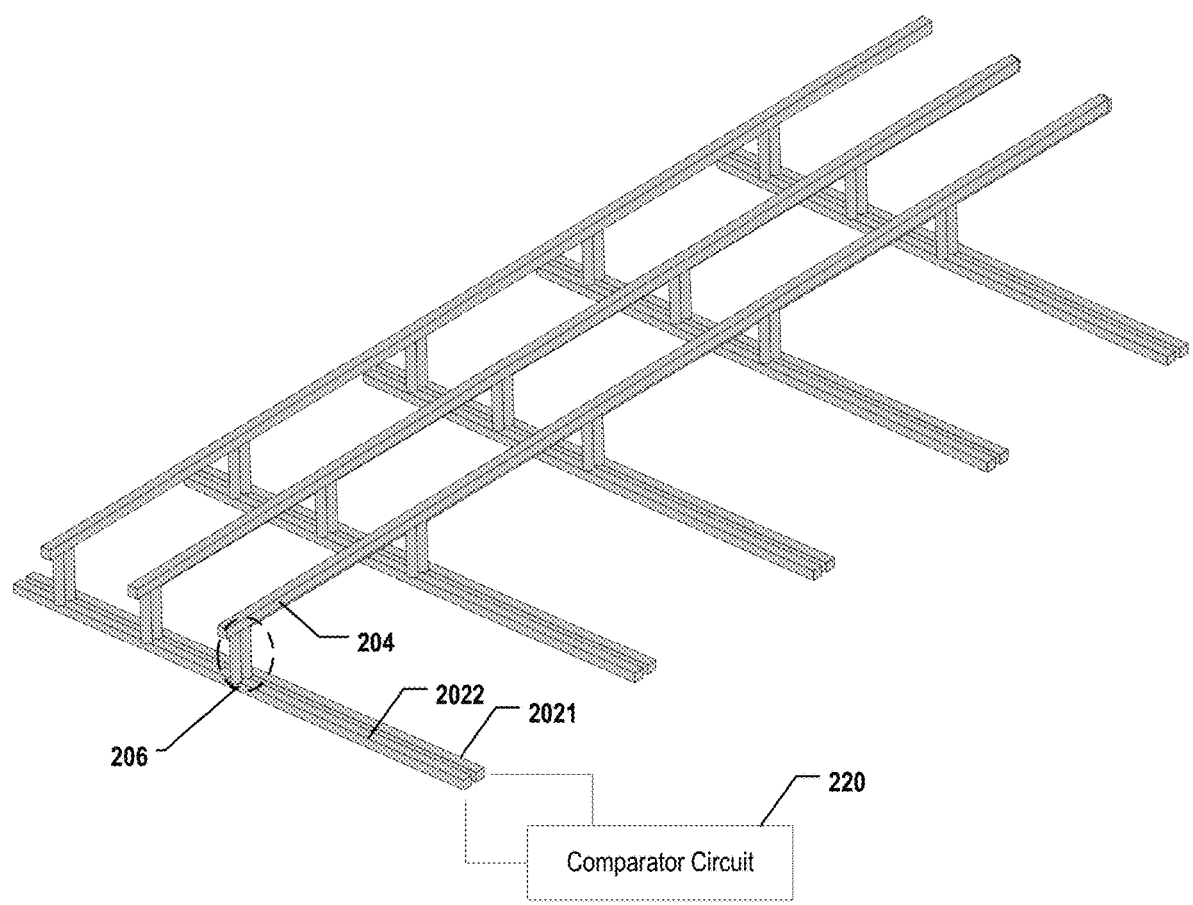
FIG. 2 illustrates a block diagram of an exemplary PCM memory device with a comparator circuit, according to some aspects of the present disclosure.
Figure 2:
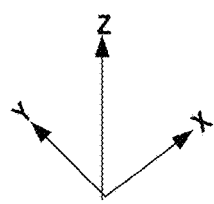

FIG. 2 illustrates a block diagram of an exemplary PCM memory device 200. Memory device 200 has a transistor-less, XPoint architecture that positions memory cells at the intersections of perpendicular conductors, according to some implementations. PCM memory device 200 includes a plurality of parallel bit lines 204 and a plurality of parallel word lines 2021 and 2022 perpendicular to bit lines 204. As shown in FIG. 2, each bit line 204 extends laterally along the bit line direction in the plan view (parallel to the wafer plane), and each word line 2021 or 2022 extends laterally along with the word line direction in the plan view.

It is noted that x and y axes are included in FIG. 2 to illustrate two orthogonal directions in the wafer plane. The x-direction is the word line direction, and the y-direction is the bit line direction. It is noted that z axis is also included in FIG. 2 to further illustrate the spatial relationship of the components in PCM memory device 200. The substrate (not shown) of PCM memory device 200 includes two lateral surfaces extending laterally in the x-y plane: a top surface on the front side of the wafer, and a bottom surface on the backside opposite to the front side of the wafer. The z axis is perpendicular to both the x and y axes. As used herein, whether one component (e.g., a layer or a device) is "on," "above," or "below" another component (e.g., a layer or a device) of a semiconductor device (e.g., PCM memory device 200) is determined relative to the substrate of the semiconductor device in the z-direction (the vertical direction perpendicular to the x-y plane) when the substrate is positioned in the lowest plane of the semiconductor device in the z-direction. The same notion for describing the spatial relationship is applied throughout the present disclosure.

As shown in FIG. 2, PCM memory device 200 includes a plurality of memory cells 206 each disposed at an intersection of bit line 204 and respective word lines (e.g., first word line 2021 and second word line 2022). In some implementations, each memory cell 206 includes at least one or more PCM elements and one or more selectors stacked vertically. In one example, each memory cell 206 may include two PCM elements and two selectors stacked vertically. And each memory cell 206 is configured to be coupled with two word lines via two selectors. In another example, each memory cell 206 may include three PCM elements and three respective selectors stacked vertically. In still another example, each memory cell 206 may include a single PCM element and two or more respective selectors stacked vertically. Each memory cell 206 may store one or more bits of data and can be written or read by varying the voltage applied to respective selectors, which replaces the need for transistors. Each memory cell 206 is accessed individually by a current applied through the top and bottom conductors in contact with each memory cell 206, e.g., respective word lines 2021, 2022, and bit line 204. Memory cells 206 in PCM memory device 200 are arranged in a memory array. In some implementations, memory cell 206 can further include a comparator circuit 220 coupled with first word line 2021 and second word line 2022 such that comparator circuit 220 is configured to compare voltage signals from first and second word lines 2021 and 2022. The result of the comparator circuit can be 1 or 0, and thus the result can be stored as a memory bit. As such, the result of the comparator circuit can be used to replace the conventional way or to provide an additional way to define the memory bit. In some implementations, memory cell 206 may include one or more comparator circuit 220, and each is coupled with two of multiple word lines such that each comparator circuit 220 is configured to compare voltage signals between two of the multiple word lines. As such, each comparator circuit 220 is configured to compare every two out of N signals received from the N word lines and output a bit (either 1 or 0). In some implementations, comparator circuit 220 can be included in memory controller 106 (e.g., in FIG. 1) and coupled with two of the multiple word lines of memory device 104 (e.g., in FIG. 1). In some implementations, comparator circuit 220 includes a voltage comparator circuit or an operational amplifier (op-amp) comparator circuit.

Figure 3A:
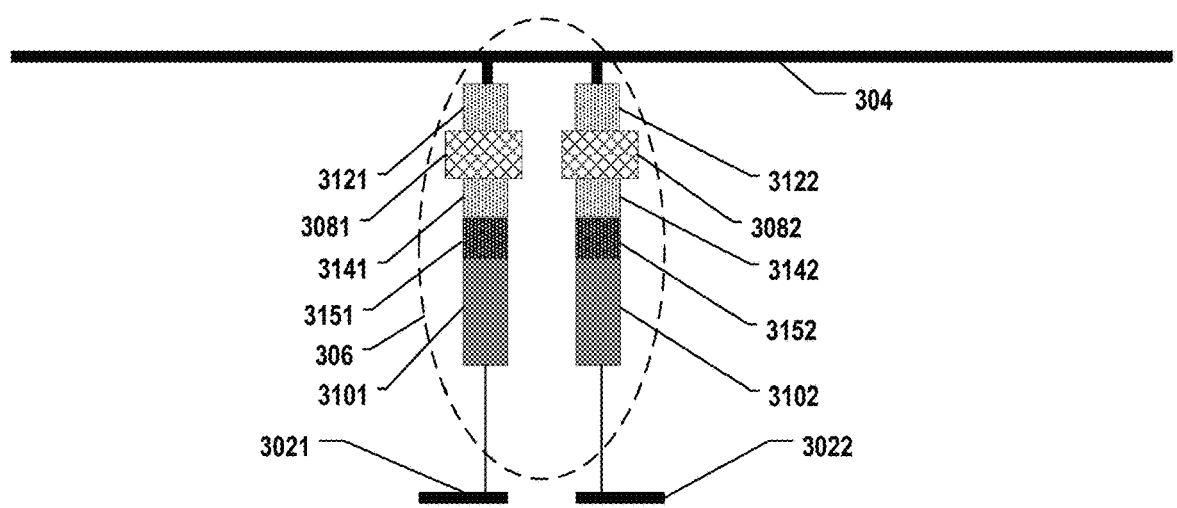
FIG. 3A illustrates a schematic view of a cross-section of an exemplary PCM memory device according to some aspects of the present disclosure.

FIG. 3A illustrates a schematic view of a cross-section of an exemplary PCM memory device 300 (e.g., corresponding to 200 in FIG. 2) according to some aspects of the present disclosure. It is noted that x and y axes are included in FIG. 3A to further illustrate the spatial relationship of the components in PCM memory device 300. As shown in FIG. 3A, PCM memory device 300 includes a bit line 304 (e.g., corresponding to 204 in FIG. 2) extending laterally in the x-y plane, one or more memory cells 306 (e.g., corresponding to 206 in FIG. 2) coupled with bit line 304. Each memory cell 306 includes N phase-change memory (PCM) elements, where N is a positive integer greater than 1. For example, when N equals 2, each memory cell 306 includes a first PCM element 3081 and a second PCM element 3082, and N selectors, for example, a first selector 3101 and a second selector 3102, coupled with a respective PCM element. PCM memory device 300 may further include N word lines, for example, a first word line 3021 (e.g., corresponding to first word line 2021 in FIG. 2) and a second word line 3022 (e.g., corresponding to second word line 2022 in FIG. 2) extending laterally in the x-y plane. Each word line is coupled with a respective selector. In some implementations, each word line is perpendicular to the bit line in the x-y plane. In some implementations, a first top electrode 3121 is formed and coupled between bit line 304 and first PCM element 3081, and a second top electrode 3122 is formed and coupled between bit line 304 and second PCM element 3082. In some implementations, a first bottom electrode 3141 is formed and coupled between first selector 3101 and first PCM element 3081, and a second bottom electrode 3142 is formed and coupled between second selector 3102 and second PCM element 3082. In some implementations, PCM memory device 300 can further include one or more heaters 3151 and 3152 coupled between first bottom electrode 3141 and first PCM element 3081, and second bottom electrode 3142 and second PCM element 3082, respectively. Heaters 3151 and 3152 are configured to increase the temperature of the programing region of the PCM element and thus reduce the magnitude of the current needed to induce a phase change of the PCM element.

Bit line 304 and word lines 3021 and 3022 can include conductive materials including, but not limited to, tungsten (W), cobalt (Co), copper (Cu), aluminum (Al), polysilicon, doped silicon, silicide, or any combination thereof. In some implementations, each bit line 304 and word lines 3021 and 3022 include a metal, such as tungsten.

Each memory cell 306 can be accessed individually by a current applied through respective word lines 3021, 3022, and bit line 304 in contact with memory cell 306. Each memory cell 306 may include, for example, two PCM elements and two respective selectors and thus may store two bits in a single memory cell 306. Furthermore, two voltage signals across the two PCM elements and two respective selectors may be compared via the comparator circuit (e.g., 220 in FIG. 2) to output a bit (either 1 or 0) to be stored as memory bits, thereby providing multiple ways to store data in a single cell. By combining different methods of storing data, an MLC, TLC, or QLC design can be achieved. Furthermore, the two voltage signals across the two PCM elements and two respective selectors may also be used to determine whether one of the two PCM elements is failed, thereby correct the error bit.

One way to determine whether there is erroneous reading is to compare the present resistance (by applying a read signal) of the PCM element with reference resistances of such PCM element (e.g., reference resistances of a high resistance state and a low resistance state). If a difference (e.g., it can be either voltage difference or current difference) between high resistance and the present resistance and another difference between low resistance and the present resistance are switched from positive to negative or from negative to positive, the PCM element is well-functioned. In contrast, if a difference between high resistance and the present resistance and another difference between low resistance and the present resistance are not switched from positive to negative or from negative to positive, the PCM element is failed due to its failure to switch between high resistance state and low resistance state. However, this method cannot be accurate if there is an occurrence of resistance-drift. The resistance-drift will make the determination wrong since the PCM element may not be failed but just change to higher resistance or a lower resistance in both high resistance state and low resistance state.

Another way to determine whether there is erroneous reading precisely is to reduce the inference of the resistance-drift. In PCM devices, the amorphous or high resistance states are not entirely stable. Melt-quenched amorphous regions created inside the chalcogenide layer undergo structural relaxations and thus the resistance of the PCM device tends to increase with time which is known as the resistance-drift, which leads to a higher risk of erroneous reading. The erroneous reading can be defined, by comparing a reference resistance value of the PCM element, with a present resistance value of the PCM element (or their corresponding voltage value). For example, a reference resistance may be defined as a crystalline state (e.g., represented as "1"), and a present resistance of the PCM element, though in a crystalline state, may have a much higher resistance value than the reference resistance value due to the resistance-drift. As such, the present resistance of the PCM element is misread out as an amorphous state rather than a crystalline state which leads to the erroneous reading. Although the resistance-drift may cause erroneous reading, two PCM elements operated at the same time may have the same tendency to the resistance-drift. For instance, the two PCM elements may increase their corresponding resistances in the same proportion. Therefore, when determining whether one of the two PCM elements is failed, a voltage difference between two PCM elements can be used to determine whether one of them is failed and at the same time, offset the inference of resistance-drift.

PCM elements 3081 and 3082 can utilize the difference between the resistivity of the amorphous and the crystalline phase in phase-change materials based on heating and quenching of the phase-change materials electrothermally. Electrical currents can be applied to switch the phase-change material (or at least a fraction of it that blocks the current path) of PCM elements 3081 and 3082 repeatedly between the two phases to store data. Two bits of data can be stored in each memory cell 306 and can be written or read by varying the voltage applied to respective selectors 3101 and 3102, which eliminates the need for transistors. During operations, the set and reset state of the PCM element refers to the low and high-resistance states, respectively. After fabrication, the phase change material is in the crystalline, low-resistance state because the processing temperature of the conductive metal layers (e.g., electrodes or bit lines) is sufficient to crystallize the phase change material. To reset the PCM element into the amorphous phase, the programming region is first melted and then quenched rapidly by applying a large electrical current pulse for a short time period. Doing so leaves a region of amorphous, highly resistive material in the PCM element. This amorphous region is in series with any crystalline region of the PCM element and effectively determines the resistance of the PCM element between the top electrode and the bottom electrode. To set the PCM element into the crystalline phase, a medium electrical current pulse is applied to anneal the programming region at a temperature between the crystallization temperature and the melting temperature for a time period long enough to crystallize. To read the state of the programming region, the resistance of the PCM element is measured by passing an electrical current small enough not to disturb the current state. It is noted that, in some implementations, each one of selectors 3101 and 3102 can be replaced by a transistor, a diode, or any other devices that can be used to switch On and OFF the PCM element.

The materials of PCM elements 3081, 3082 include chalcogenide-based composition, including chalcogenide-based alloys and chalcogenide-based glass), such as GST (Ge—Sb—Te) alloy, or any other suitable phase-change materials, according to some implementations. The materials of selectors 3101 and 3102 can include any suitable ovonic threshold switch (OTS) materials, such as $Zn_xTe_y$, $Ge_xTe_y$, $Nb_xO_y$, $Si_xAs_yTe_z$, or a combination thereof. It is understood that the structure, configuration, and materials of PCM memory device 300 are not limited to the example in FIG. 3A and may include any suitable structure, configuration, and materials. Top and bottom electrodes 3121, 3122, 3141, and 3142 can include conductive materials including, but not limited to, W, Co, Cu, Al, carbon, polysilicon, doped silicon, silicide, or any combination thereof. In some implementations, each electrode 3121, 3122, 3141, or 3142 includes carbon, such as amorphous carbon.

Figure 3B:
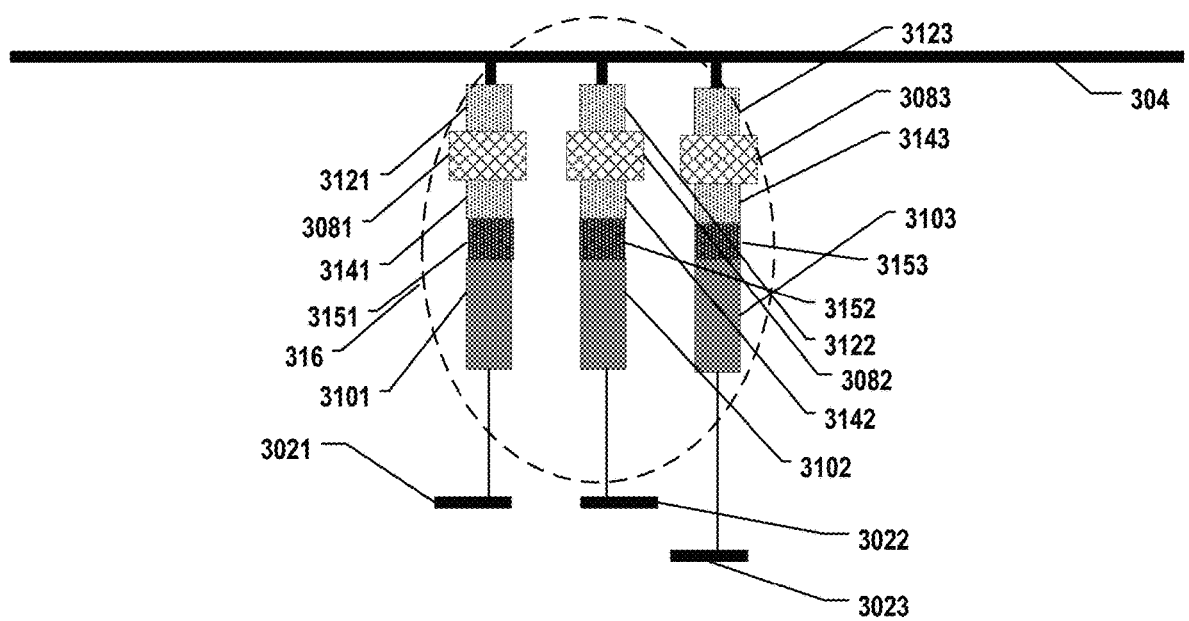
FIG. 3B illustrates a schematic view of a cross-section of another exemplary PCM memory device according to some aspects of the present disclosure.

FIG. 3B illustrates a schematic view of a cross-section of another exemplary PCM memory device 330 (e.g., corresponding to 200 in FIG. 2) according to some aspects of the present disclosure. It is noted that x and y axes are included in FIG. 3B to further illustrate the spatial relationship of the components in PCM memory device 330. As shown in FIG. 3B, PCM memory device 330 includes a bit line 304 (e.g., corresponding to 204 in FIG. 2) extending laterally in the x-y plane, one or more memory cells 316 (e.g., corresponding to 206 in FIG. 2) coupled with bit line 304. Each memory cell 316 includes N (PCM elements, where N is a positive integer greater than 1. For example, when N equals 3, each memory cell 316 includes a first PCM element 3081, a second PCM element 3082, and a third PCM element 3083, and N selectors, for example, a first selector 3101, a second selector 3102, and a third selector 3103 coupled with a respective PCM element. PCM memory device 330 may further include N word lines, for example, first word line 3021 (e.g., corresponding to first word line 2021 in FIG. 2), second word line 3022 (e.g., corresponding to second word line 2022 in FIG. 2), and third word line 3023 extending laterally in the x-y plane. Each word line is coupled with a respective selector. In some implementations, each word line is intersected with the bit line in the x-y plane. In one example, each word line is further perpendicular to the bit line in the x-y plane. In some implementations, a first top electrode 3121 is formed and coupled between bit line 304 and first PCM element 3081, a second top electrode 3122 is formed and coupled between bit line 304 and second PCM element 3082, and a third top electrode 3123 is formed and coupled between bit line 304 and third PCM element 3083. In some implementations, a first bottom electrode 3141 is formed and coupled between first selector 3101 and first PCM element 3081, a second bottom electrode 3142 is formed and coupled between second selector 3102 and second PCM element 3082, and a third bottom electrode 3143 is formed and coupled between third selector 3103 and third PCM element 3083. In some implementations, PCM memory device 330 can further include one or more heaters 3151, 3152, and 3153 coupled between first bottom electrode 3141 and first PCM element 3081, second bottom electrode 3142 and second PCM element 3082, and third bottom electrode 3143 and third PCM element 3083, respectively. Heaters 3151, 3152, and 3153 are configured to increase the temperature of the programing region of the PCM element and thus reduce the magnitude of the current needed to induce a phase change of the PCM element.

PCM memory device 330 in FIG. 3B is similar to PCM memory device 300 in FIG. 3A except for the additional third PCM element, third selector, third word line, third top electrode, third bottom electrode, and heater. The structures, functions, and materials of the same components that have been described above with respect to PCM memory device 330 in FIG. 3B are not repeated for ease of description.

Each memory cell 316 can be accessed individually by a current applied through respective word lines 3021, 3022, and 3023, and bit line 304 in contact with memory cell 316. Each memory cell 316 may include, for example, three PCM elements and three respective selectors and thus may store three bits in a single memory cell 316. Furthermore, three voltage signals across every two PCM elements and two respective selectors may be compared via the comparator circuit (e.g., 220 in FIG. 2) to output a bit (either 1 or 0) to be stored as memory bits, thereby providing multiple ways to store data in a single cell. By combining different methods of storing data, an MLC, TLC, or QLC design can be achieved. For instance, a first range of voltage in a first resistance state, a second range of voltage in a second resistance state, and a third range of voltage in a third resistance state can be three bits. The comparator circuit, which outputs 3 sets of bits (either 1 or 0), can provide additional three bits to be stored. Therefore, by leveraging multiple methods of storing bits, the present disclosure provides more flexibility for circuit design to achieve MLC, TLC, or QLC architecture.

Figure 3C:
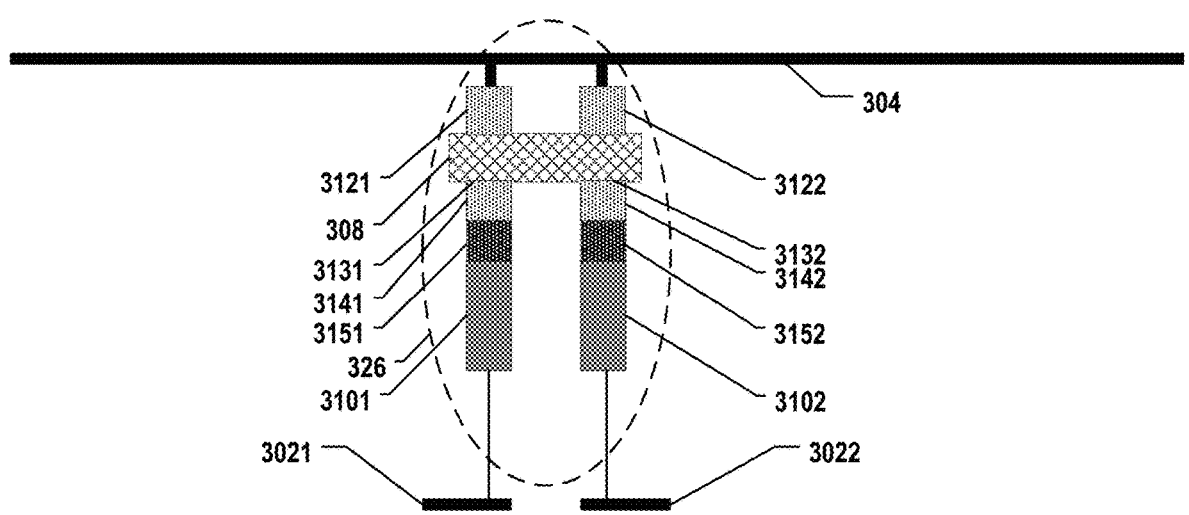
FIG. 3C illustrates a schematic view of a cross-section of still another exemplary PCM memory device according to some aspects of the present disclosure.

FIG. 3C illustrates a schematic view of a cross-section of still another exemplary PCM memory device 350 (e.g., corresponding to 200 in FIG. 2) according to some aspects of the present disclosure. It is noted that x and y axes are included in FIG. 3C to further illustrate the spatial relationship of the components in PCM memory device 350. As shown in FIG. 3C, PCM memory device 350 includes a bit line 304 (e.g., corresponding to 204 in FIG. 2) extending laterally in the x-y plane, one or more memory cells 326 (e.g., corresponding to 206 in FIG. 2) coupled with bit line 304. Each memory cell 326 includes a PCM element, for example, a common PCM element 308, and N selectors, where N is a positive integer greater than 1. For example, when N equals 2, each memory cell 326 includes first selector 3101, and second selector 3102 coupled with common PCM element 308. It is noted that the "common" PCM element or "common" electrode hereinafter refer to a shared node or structure that can be coupled by different nodes or structures. It is also noted that the "common" hereinafter does not necessarily mean to have the same voltage potential across the entire structure. For instance, the common PCM element can have two voltages across two different parts of the common PCM element when two voltages are applied upon the two different parts. PCM memory device 350 may further include N word lines, for example, a first word line 3021 (e.g., corresponding to first word line 2021 in FIG. 2), and a second word line 3022 (e.g., corresponding to second word line 2022 in FIG. 2) extending laterally in the x-y plane. Each word line is coupled with a respective selector.

In some implementations, each word line is perpendicular to the bit line in the x-y plane. In some implementations, a first top electrode 3121 is formed and coupled between bit line 304 and common PCM element 308, and a second top electrode 3122 is formed and coupled between bit line 304 and common PCM element 308. In some implementations, a first bottom electrode 3141 is formed and coupled between first selector 3101 and common PCM element 308 in a first contact region 3131, and a second bottom electrode 3142 is formed and coupled between second selector 3102 and common PCM element 308 in a second contact region 3132. In some implementations, PCM memory device 350 can further include one or more heaters 3151 and 3152 coupled between first bottom electrode 3141 and common PCM element 308 in first contact region 3131, and second bottom electrode 3142 and common PCM element 308 in second contact region 3132, respectively. Heaters 3151 and 3152 are configured to increase the temperature of the programing region of the PCM element and thus reduce the magnitude of the current needed to induce a phase change of the PCM element.

PCM memory device 350 in FIG. 3C is similar to PCM memory device 300 in FIG. 3A except for common PCM element 308. Common PCM element 308 is configured to be formed by first PCM element 3081 (e.g., in FIG. 3A) and second PCM element 3082 (e.g., in FIG. 3A). The structures, functions, and materials of the same components that have been described above with respect to PCM memory device 350 in FIG. 3C are not repeated for ease of description.

Each memory cell 326 can be accessed individually by a current applied through respective word lines 3021, and 3022, and bit line 304 in contact with memory cell 326. Each memory cell 326 may include, for example, common PCM element 308 and two respective selectors 3101 and 3102, and thus may store two bits in a single memory cell 326. Furthermore, two voltage signals across two PCM elements and two respective selectors may be compared via the comparator circuit (e.g., 220 in FIG. 2) to output a bit (either 1 or 0) to be stored as memory bits, thereby providing multiple ways to store multiple bits in a single cell. By combining different methods of storing data, an MLC, TLC, or QLC design can be achieved. For instance, a first range of voltage in a first resistance state, and a second range of voltage in a second resistance state can be defined as one bit per PCM element and two bits per PCM memory device 350. The comparator circuit which outputs 1 set of bits (either 1 or 0) can be defined as an additional one bit. Therefore, by leveraging multiple methods of storing bits, the present disclosure provides more flexibility for circuit design to achieve MLC, TLC, or QLC architecture.

Common PCM element 308 can utilize the difference between the resistivity of the amorphous and the crystalline phase in phase-change materials based on heating and quenching of the phase-change materials electrothermally. Electrical currents can be applied to switch the phase-change material (or at least a fraction of it that blocks the current path) of common PCM element 308 repeatedly between the two phases to store data. After fabrication, the phase change material of common PCM element 308 can be programmed in the crystalline, low-resistance state because the processing temperature of the conductive metal layers (e.g., electrodes or bit lines) is sufficient to crystallize the phase change material. To reset the PCM element into the amorphous phase, a programming region (e.g., an area where PCM element 308 contacts first contact region 3131 or second contact region 3132) is first melted and then quenched rapidly by applying a large electrical current pulse for a short time period. Doing so leaves a region of amorphous, highly resistive material in the PCM element. This amorphous region is in series with any crystalline region of the PCM element and effectively determines the resistance of the PCM element between the top electrode and the bottom electrode. To set the PCM element into the crystalline phase, a medium electrical current pulse is applied to anneal the programming region at a temperature between the crystallization temperature and the melting temperature for a time period long enough to crystallize. To read the state of the programming region, the resistance of the PCM element is measured by passing an electrical current small enough not to disturb the current state.

In some implementations, PCM memory device 350 can further include one or more heaters 3151 and 3152 coupled between first bottom electrode 3141 and common PCM element 308 in first contact region 3131, and second bottom electrode 3142 and common PCM element 308 in second contact region 3132, respectively. Heaters 3151 and 3152 are configured to increase the temperature of the programing region of the PCM element and thus reduce the magnitude of the current needed to induce a phase change of the PCM element.

Furthermore, common PCM element 308 can also have a failure repair function. In a conventional 1 selector (heater), 1 PCM element architecture, once the PCM element is failed to switch between a crystalline phase and amorphous phase, there is no other way to repair it. On the contrary, by using common PCM element 308 with two selectors (and heaters), once a first contact region (e.g., 3131 in FIG. 3C) of PCM element 308 is failed, another well-functioned heater (e.g., second heater 3142 in FIG. 3C) can generate more heat by applying a higher voltage across and transmit the heat from a second contact region (e.g., 3132 in FIG. 3C) of PCM element 308 to the first contact region to reactivate or repair the failed part (e.g., first contact region 3131) of PCM element 308.

Last but not the least, common PCM element 308 can provide a better chip size reduction. In particular, since common PCM element 308 is formed as a layer or a bulk rather than a piece of PCM element, the resistance states of common PCM element 308 can be divided into more states. For example, if a PCM element can be divided into 8 resistance states, a common PCM element can be divided into 16 resistance states. As such, a QLC architecture can be easily achieved.

Figure 3D:
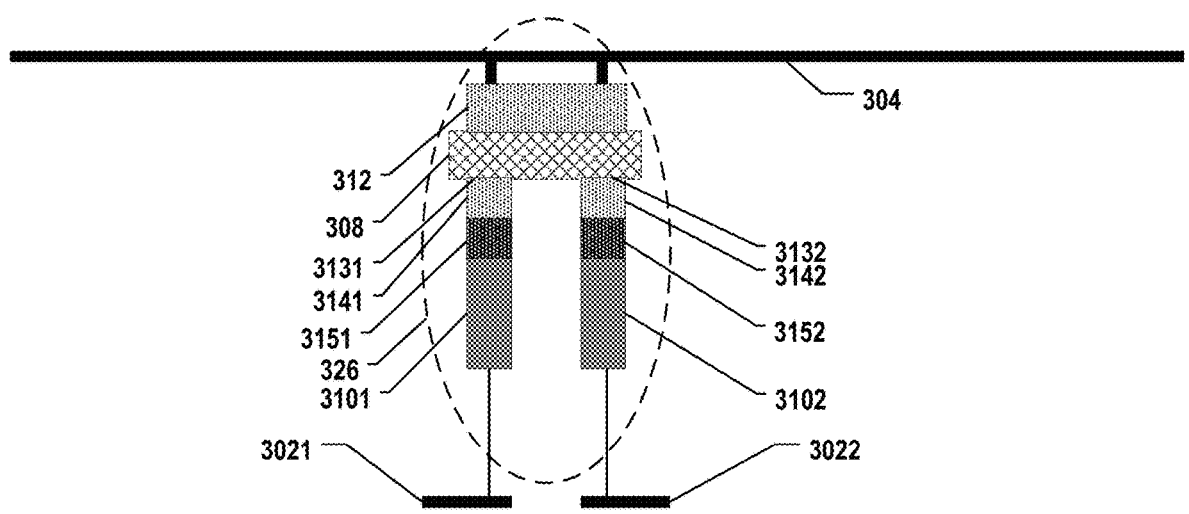
FIG. 3D illustrates a schematic view of a cross-section of yet still another exemplary PCM memory device according to some aspects of the present disclosure.

FIG. 3D illustrates a schematic view of a cross-section of an exemplary PCM memory device 370 (e.g., corresponding to 200 in FIG. 2) according to some aspects of the present disclosure. PCM memory device 350 in FIG. 3D is similar to PCM memory device 300 in FIG. 3C except for common top electrode 312. Common top electrode 312 is configured to be formed by a first top electrode (e.g., 3121 in FIG. 3C) and a second top electrode (e.g., 3122 in FIG. 3C). The structures, functions, and materials of the same components that have been described above with respect to PCM memory device 350 in FIG. 3C are not repeated for ease of description.

Common top electrode 312 can be used, in combination with common PCM element 308, to achieve the failure repair function by generating heat from different contact regions and thus form new current paths within PCM element 308, which repairs the failed part of PCM element 308.

Figure 4:
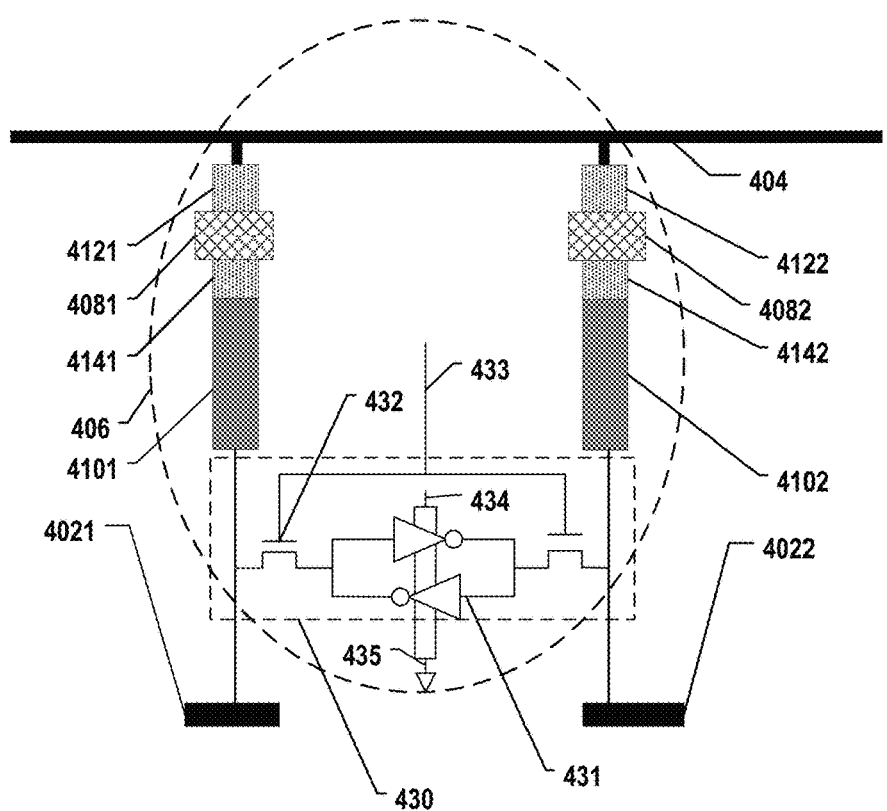
FIG. 4 illustrates a block diagram of yet still another exemplary PCM memory device according to some aspects of the present disclosure.
Figure 4:
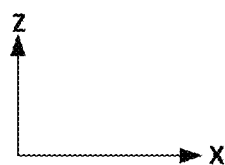

FIG. 4 illustrates a schematic view of a cross-section of an exemplary memory device 400 (e.g., corresponding to 200 in FIG. 2) according to some aspects of the present disclosure. It is noted that x and y axes are included in FIG. 4 to further illustrate the spatial relationship of the components in PCM memory device 400. As shown in FIG. 4, PCM memory device 400 includes a bit line 404 extending laterally in the x-y plane, one or more memory cells 406 (e.g., corresponding to 206 in FIG. 2) coupled with bit line 404. Each memory cell 406 includes NPCM elements, where N is a positive integer greater than 1. For example, when N equals 2, each memory cell 406 includes a first PCM element 4081 and a second PCM element 4082. Each memory cell 406 may also include N selectors, for example, a first selector 4101 and a second selector 4102, coupled with a respective PCM element. PCM memory device 400 may further include N word lines, for example, a first word line 4021 and a second word line 4022 extending laterally in the x-y plane. Each word line is coupled with a respective selector. In some implementations, each word line is perpendicular to the bit line in the x-y plane. In some implementations, a first top electrode 4121 is formed and coupled between bit line 404 and first PCM element 4081, and a second top electrode 4122 is formed and coupled between bit line 404 and second PCM element 4082. In some implementations, a first bottom electrode 4141 is formed and coupled between first selector 4101 and first PCM element 4081, and a second bottom electrode 4142 is formed and coupled between second selector 4102 and second PCM element 4082. In some implementations, PCM memory device 400 can further include one or more heaters (not shown) coupled between first bottom electrode 4141 and first PCM element 4081, and second bottom electrode 4142 and second PCM element 4082, respectively. The heater is configured to increase the temperature of the programing region of the PCM element and thus reduce the magnitude of the current needed to induce a phase change of the PCM element. PCM memory device 400 may further include an SRAM cache 430 coupled between every two of N word lines (e.g., first word line 4021 and second word line 4022).

PCM memory device 400 in FIG. 4 is similar to PCM memory device 300 in FIG. 3A except for SRAM cache 430. The structures, functions, and materials of the same components that have been described above with respect to PCM memory device 400 in FIG. 4 are not repeated for ease of description.

Each SRAM cache 430 includes a pair of cross-coupled inverters 431 and a pair of pass-gate transistors 432 coupled with pair of cross-coupled inverters 431. Pair of pass-gate transistors 432 is configured to allow pair of cross-coupled inverters 431 to be accessible by the word lines 4021 and 4022. Pair of cross-coupled inverters 431 is powered through an inverter Vdd node 434 and grounded through an inverter Vss node 435. During the operation, pair of pass-gate transistors 432 is enabled by a control line 433 and accessed by word lines 4021 and 4022 to set or reset the SRAM cache 430. That is, pair of pass-gate transistors 432 is used to read and write the data bit between cross-coupled inverters 431 and word lines 4021 and 4022 when the control line 433 switches pair of pass-gate transistors 432 on. Each pair of cross-coupled inverters 431 is configured to store a voltage difference between two respective word lines (e.g., first word line 4021 and second word line 4022) of N word lines, such that each SRAM cache 430 is configured to store the voltage differences between respective two word lines of the N word lines. When two data signals write through word lines 4021 and 4022, a voltage difference is across two sides of SRAM cache 430. When pair of pass-gate transistors 432 is off, pair of cross-coupled inverters 431 will not be affected and remain in the previous state.

When pair of pass-gate transistors 432 is on, pair of cross-coupled inverters 431 will have a voltage difference across the pair of cross-coupled inverters 431 and store the voltage difference as long as inverter Vdd node 434 supplied the power to pair of cross-coupled inverters 431. Therefore, SRAM cache 430 may retain the data bit (the voltage difference) in pair of cross-coupled inverters 431 even after the two data signals writing through word lines 4021 and 4022 have been off. By combining SRAM cache 430 to store more data bits in a single PCM memory device 400, an MLC, TLC, or QLC design can be achieved. In some implementations, SRAM cache 430 may include a 4-transistor (4T) SRAM cell, a 6-transistor (6T) SRAM cell, or an 8-transistor (8T) SRAM cell. The 6T SRAM cell includes a pair of cross-coupled Complementary Metal Oxide Semiconductor (CMOS) inverters and a pair of pass-gate transistors used for reading and writing the stored data bit. The 4T SRAM cell is a modified version of the 6T SRAM cell with two p-channel Metal-Oxide-Semiconductor (PMOS) pull-up transistors removed and replaced with denser high resistance resistors. The 8T SRAM cell is an enhanced version of the 6T SRAM cell which decouples the read port from the write port. A new read buffer including 2 n-channel Metal-Oxide-Semiconductor (N-MOS) transistors is added to the 6T SRAM cell.

Beyond the above-mentioned ways to store multiple bits in a single memory cell, there are also other ways in the present disclosure to store multiple bits in a single cell. In some implementations, the resistances of PCM elements can be divided into four states: the first PCM element is more than 2 orders of magnitude bigger than the second PCM element, the first PCM element is less than 2 orders of magnitude bigger than the second PCM element, the first PCM element is less than 2 orders of magnitude smaller than the second PCM element, and the first PCM element is more than 2 orders of magnitude smaller than the second PCM element. These four states can represent additional four bits to be stored. This method can also be implemented using the comparator circuit (e.g., 220 in FIG. 2).

Figure 5:
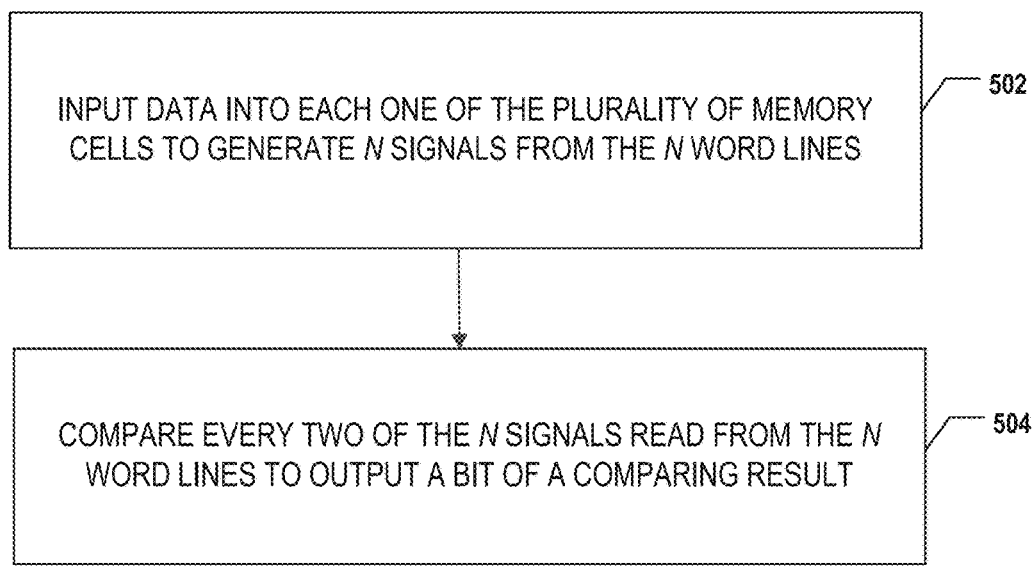
FIG. 5 illustrates a flowchart of an exemplary method of operating a memory device according to some aspects of the present disclosure.

FIG. 5 illustrates a flowchart of an exemplary method of operating a memory device according to some implementations of the present disclosure. Examples of the PCM memory device depicted in FIG. 5 include PCM memory devices 200, 300, 330, and 350 depicted in FIGS. 2 and 3A-3C. It is understood that the operations shown in method 500 are not exhaustive and that other operations can be performed as well before, after, or between any of the illustrated operations. Further, some of the operations may be performed simultaneously, or in a different order than shown in FIG. 5.

In some implementations, each of the PCM memory devices (e.g., corresponding to PCM memory devices 200, 300, 330, or 350) being operated by method 500 may include a bit line (e.g., corresponding to 304 in FIG. 3A) and a plurality of memory cells (e.g., corresponding to 306 in FIG. 3A) coupled with the bit line. Each one of the plurality of memory cells includes N PCM elements (e.g., corresponding to 3081 and 3082 in FIG. 3A), and N selectors (e.g., corresponding to 3101 and 3102 in FIG. 3A), where N is a positive integer greater than 1. Each one of the N selectors is coupled with a respective one of the N PCM elements. Each one of the PCM memory devices may further include N word lines (e.g., corresponding to 3021 and 3022 in FIG. 3A). Each one of the N word lines is coupled with a respective one of the N selectors.

Referring to FIG. 5, method 500 starts at operation 502, in which data is applied into each one of the plurality of memory cells to generate N signals from the N word lines. In some implementations, method 500 is used in a read operation during which a small read current is applied. The small read current is small enough to ensure that the phase change material does not undergo an undesired phase change during the reading. In some implementations, the data includes a read voltage or a read current. After writing the data into each memory cells, N signals, for instance, N voltage signals, from the N word lines can be generated. Each one of the N signals may include a voltage signal or a current signal. In one example, after a read voltage is applied, a current signal can be generated and read from the word line. In another example, after a read current is applied, a voltage signal can be generated and read across the memory cell. In still another example, after a read voltage is applied, a voltage signal can be generated and read across the memory cell.

Method 500 proceeds to operation 504, as illustrated in FIG. 5, in which each two of the N signals read from the N word lines are compared, and a bit of a comparing result is output. In some implementations, the comparing operation can be implemented by a comparator circuit 220 in FIG. 2. Each comparing result can be executed by each comparator circuit or a comparator circuit that can perform multiple comparisons. The comparing result is either 1 or 0, which represents a bit to be stored. In some implementations, each two of the N signals read from the N word lines include a respective first input signal and a respective second input signal. And the comparing process in operation 504 may further include, in response to that the first input signal is greater than the second input signal, outputting the bit as 1, and in response to that the first input signal is less than the second input signal, outputting the bit as 0. If the first input signal is equal to the second input signal, this condition can produce an indeterminate operation. That is, the output may be at either of the two normal output voltage levels or, more probably, oscillating between the two output levels. This erratic behavior is overcome by adding positive feedback to the comparator.

Figure 6:
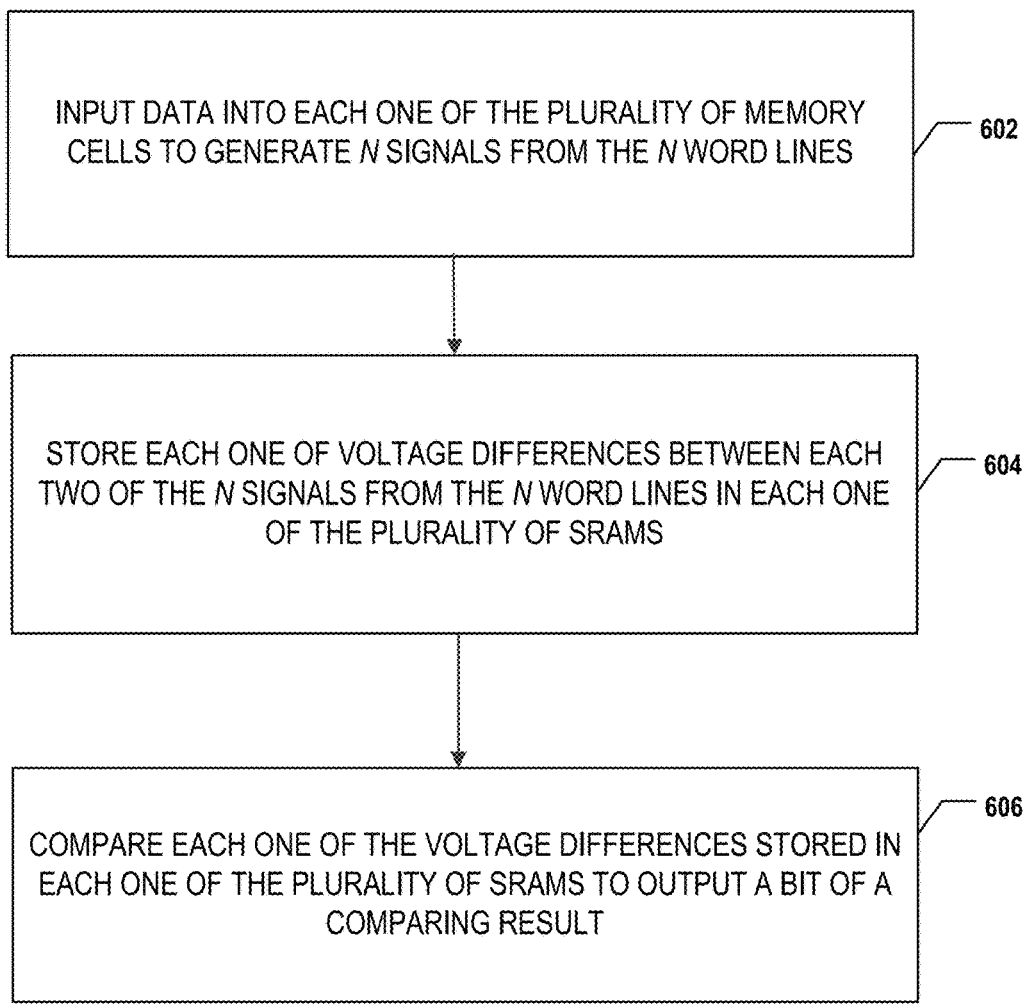
FIG. 6 illustrates a flowchart of another exemplary method of operating a memory device according to some aspects of the present disclosure.

FIG. 6 illustrates a flowchart of another exemplary method of operating a memory device according to some implementations of the present disclosure. Examples of the PCM memory device depicted in FIG. 6 include PCM memory devices 200 and 400 depicted in FIGS. 2 and 4. It is understood that the operations shown in method 600 are not exhaustive and that other operations can be performed as well before, after, or between any of the illustrated operations. Further, some of the operations may be performed simultaneously, or in a different order than shown in FIG. 6.

In some implementations, each of the PCM memory devices (e.g., corresponding to PCM memory devices 200 or 400) being operated by method 600 may include a bit line (e.g., corresponding to 404 in FIG. 4) and a plurality of memory cells (e.g., corresponding to 406 in FIG. 4) coupled with the bit line. Each one of the plurality of memory cells includes N PCM elements (e.g., corresponding to 4081 and 4082 in FIG. 4), and N selectors (e.g., corresponding to 4101 and 4102 in FIG. 4), where N is a positive integer greater than 1. Each one of the N selectors is coupled with a respective one of the N PCM elements. Each of the PCM memory devices further includes N word lines (e.g., corresponding to 4021 and 4022 in FIG. 4). Each one of the N word lines is coupled with a respective one of the N selectors. Each of the PCM memory devices further includes a plurality of SRAMs (e.g., corresponding to 430 in FIG. 4). Each one of the plurality of SRAMs is coupled between each two of the N word lines, and each one of the N word lines is coupled with a respective one of the N selectors.

Referring to FIG. 6, method 600 starts at operation 602, in which data is writing into each one of the plurality of memory cells to generate N signals from the N word lines. In some implementations, method 600 is used in a read operation during which a small read current is applied. The small read current is small enough to ensure that the phase change material does not undergo an undesired phase change during the reading. In some implementations, the data includes a read voltage or a read current. After writing the data into each memory cells, N signals, for instance, N voltage signals, from the N word lines can be generated. Each one of the N signals may include a voltage signal or a current signal.

Method 600 proceeds to operation 604, as illustrated in FIG. 6, in which each one of the voltage differences between each two of the N signals from the N word lines is stored in each one of the plurality of SRAMs. In some implementations, each one of the plurality of SRAMs is switched on by a respective pair of pass-gate transistors (e.g., 432 in FIG. 4) via a control line 433 and accessed by word lines (e.g., 4021 and 4022 in FIG. 4) to store the voltage differences in each one of the plurality of SRAMs (e.g., 430 in FIG. 4).

Method 600 proceeds to operation 606, as illustrated in FIG. 6, in which each one of the voltage differences stored in each one of the plurality of SRAMs representing each two of the N signals from the N word lines is compared, and a bit of a comparing result is output. In some implementations, the comparing operation can be implemented by a comparator circuit 220 in FIG. 2. Each comparing result can be executed by each comparator circuit or a comparator circuit that can perform multiple comparisons. The comparing result is either 1 or 0, which represents a bit to be stored. In some implementations, each one of the plurality of SRAMs includes a pair of cross-coupled inverters (e.g., 431 in FIG. 4) and a pair of pass-gate transistors (e.g., 432 in FIG. 4) configured to allow the pair of cross-coupled inverters to be accessible by each two of the N word lines. In some implementations, each pair of cross-coupled inverters is configured to store the voltage difference between the respective two of the N word lines, such that the plurality of SRAMs is configured to store the voltage differences between every two of the N word lines, respectively.

Figure 7:
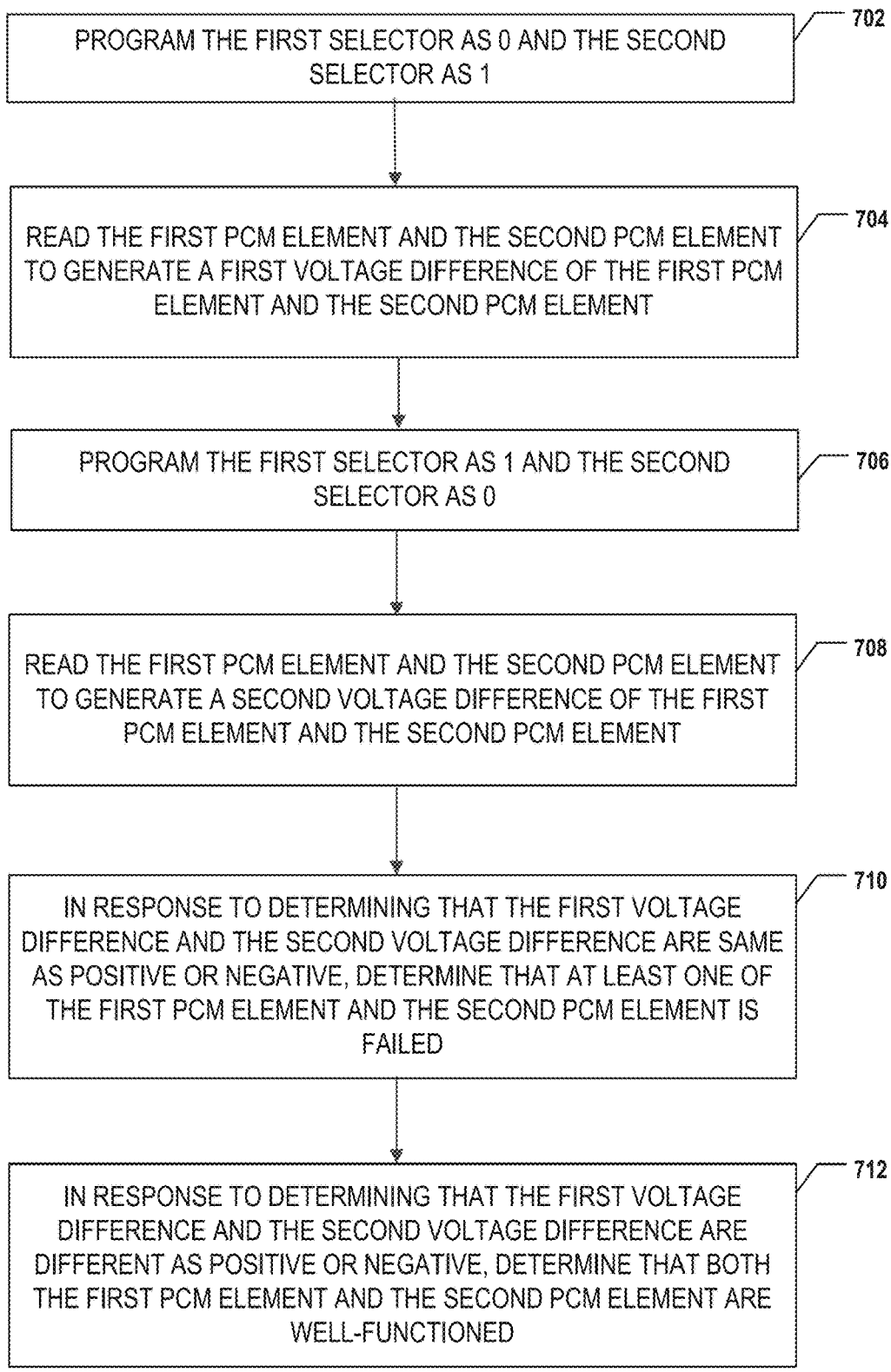
FIG. 7 illustrates a flowchart of another exemplary method of operating a memory device according to some aspects of the present disclosure.

FIG. 7 illustrates a flowchart of another exemplary method of operating a memory device according to some implementations of the present disclosure. Examples of the PCM memory device depicted in FIG. 7 include PCM memory devices 200 and 400 depicted in FIGS. 2 and 4. It is understood that the operations shown in method 600 are not exhaustive and that other operations can be performed as well before, after, or between any of the illustrated operations. Further, some of the operations may be performed simultaneously, or in a different order than shown in FIG. 7.

In some implementations, each of the PCM memory devices (e.g., corresponding to PCM memory devices 200 or 400) being operated by method 700 may include a bit line (e.g., corresponding to 404 in FIG. 4) and a plurality of memory cells (e.g., corresponding to 406 in FIG. 4) coupled with the bit line. Each one of the plurality of memory cells includes N PCM elements (e.g., corresponding to 4081 and 4082 in FIG. 4), and N selectors (e.g., corresponding to 4101 and 4102 in FIG. 4), where N is a positive integer greater than 1. Each one of the N selectors is coupled with a respective one of the N PCM elements. Each of the PCM memory devices further includes N word lines (e.g., corresponding to 4021 and 4022 in FIG. 4). Each one of the N word lines is coupled with a respective one of the N selectors. Each of the PCM memory devices further includes a plurality of SRAMs (e.g., corresponding to 430 in FIG. 4). Each one of the plurality of SRAMs is coupled between each two of the N word lines, and each one of the N word lines is coupled with a respective one of the N selectors. In some implementations, the N is 2, such that the two PCM elements and the two selectors can be used to determine whether there is a failed PCM element.

Referring to FIG. 7, method 700 starts at operation 702, in which the first selector is programed as 0 and the second selector is programed as 1. To program the first selector as 0 and the second selector as 1, a set or reset voltage can be applied upon the selectors and the PCM elements. And then, a read operation during which a small read current is applied. The small read current is small enough to ensure that the phase change material does not undergo an undesired phase change during the reading.

Method 700 proceeds to operation 704, as illustrated in FIG. 7, in which the first PCM element and the second PCM element are read to generate a first voltage difference of the first PCM element and the second PCM element. In particular, a read current is applied, and a first voltage of the first PCM element is measured, and a second voltage of the second PCM element is measured. A first voltage difference between two voltages of two PCM elements is then generated.

Method 700 proceeds to operation 706, as illustrated in FIG. 7, in which the first selector is programed as 1 and the second selector is programed as 0. To program the first selector as 1 and the second selector as 0, a set or reset voltage can be applied upon the selectors and the PCM elements. And then, a read operation during which a small read current is applied. The small read current is small enough to ensure that the phase change material does not undergo an undesired phase change during the reading.

Method 700 proceeds to operation 708, as illustrated in FIG. 7, in which the first PCM element and the second PCM element are read to generate a second voltage difference of the first PCM element and the second PCM element. In particular, a read current is applied, and a first voltage of the first PCM element is measured, and a second voltage of the second PCM element is measured. A second voltage difference between two voltages of two PCM elements is then generated.

Method 700 proceeds to operation 710, as illustrated in FIG. 7, in which, in response to determining that the first voltage difference and the second voltage difference are the same as positive or negative, one of the first PCM element and the second PCM element is determined as failed.

Method 700 proceeds to operation 712, as illustrated in FIG. 7, in which, in response to determining that the first voltage difference and the second voltage difference are different as positive or negative, both the first PCM element and the second PCM element are determined as well-functioned.

In some implementations, reading the first PCM element and the second PCM element in method 700 includes generating a first readout signal and a second readout signal, and the reading is complete before the first readout signal and the second readout signal stabilize. It is noted that, because the PCM element has a parasite capacitor inside, the readout signal may increase over time. Normally the reading operation is completed after the readout signal is stabilized. Since it only requires a voltage difference rather than a present voltage to be measured, it does not have to wait until the readout signal is stabilized. Therefore, a higher speed of data readout can be achieved.

FIGS. 8A-8C illustrate tables of readout voltages of different resistance states and their corresponding voltage differences of method 700 of operating a memory device according to some aspects of the present disclosure. As shown in FIG. 8A, amorphous state is a high resistance state and therefore is defined as logic 0. Crystalline state is a low resistance state and therefore is defined as logic 1. Failure state is an extremely high resistance state and therefore is defined as F.

As shown in FIG. 8B, a first selector is programming the PCM element as 1, a low resistance state, and a second selector is programming the PCM element as 0, a high resistance state, as shown in FIG. 8B and as the operation 702 in FIG. 7. When the first readout signal is applied to read the first PCM element and the second PCM element, the first voltage difference of the first PCM element and the second PCM element is generated as negative, as shown in FIG. 8B and as the operation 704 in FIG. 7. Next, the first selector is programming the PCM element as 0, a high resistance state, and the second selector is programming the PCM element as 1, a low resistance state, as shown in FIG. 8B and as the operation 706 in FIG. 7. When the second readout signal is applied to read the first PCM element and the second PCM element, the second voltage difference of the first PCM element and the second PCM element is generated as positive, as shown in FIG. 8B and as the operation 708 in FIG. 7. In response to determining that the first voltage difference and the second voltage difference are different as positive or negative, as shown in FIG. 8B, it is determined that both the first PCM element and the second PCM element are well-functioned, as the operation 712 in FIG. 7. However, in the case of FIG. 8C, when a failed PCM element existed, it will show a different result.

As shown in FIG. 8C, a first selector is programming the PCM element as 1, a low resistance state, and a second selector is programming as 0 on a failed PCM element, an extremely high resistance state, as shown in FIG. 8C and as the operation 702 in FIG. 7. When the first readout signal is applied to read the first PCM element and the second PCM element, the first voltage difference of the first PCM element and the second PCM element is generated as negative, as shown in FIG. 8C and as the operation 704 in FIG. 7. Next, the first selector is programming the PCM element as 0, a high resistance state, and the second selector is programming as 1 on the failed PCM element, an extremely high resistance state, as shown in FIG. 8C and as the operation 706 in FIG. 7. When the second readout signal is applied to read the first PCM element and the second PCM element, the second voltage difference of the first PCM element and the second PCM element is generated as negative, as shown in FIG. 8C and as the operation 708 in FIG. 7. In response to determining that the first voltage difference and the second voltage difference are the same as positive or negative, as shown in FIG. 8C, it is determined that at least one of the first PCM element and the second PCM element is failed, as the operation 710 in FIG. 7.

According to one aspect of the present disclosure, a memory device includes a bit line, a plurality of memory cells coupled with the bit line, and N selectors, where N is a positive integer greater than 1, and N word lines. Each one of the plurality of memory cells includes N phase-change memory (PCM) elements. Each one of the N selectors is coupled with a respective one of the N PCM elements. Each one of the N word lines is coupled with a respective one of the N selectors.

In some implementations, the memory device further includes a plurality of comparator circuits. Each one of the plurality of comparator circuit coupled with two of the N word lines such that each one of the plurality of comparator circuit is configured to compare every two of N signals received from the N word lines and output a bit for each comparing result.

In some implementations, each one of the N signals includes a voltage signal, and each one of the plurality of comparator circuits includes an operational amplifier (op-amp) comparator circuit or a voltage comparator circuit.

In some implementations, the memory device further includes a plurality of top electrodes formed on the respective N PCM element.

In some implementations, each one of the plurality of top electrodes is formed between the bit line and the respective one of the N PCM elements, and a plurality of bottom electrodes. Each one of the plurality of bottom electrodes is formed between the respective one of the N word lines and the respective one of the N selectors.

In some implementations, the memory device further includes a plurality of static random-access memories (SRAMs). Each one of the plurality of SRAMs is coupled between each two of the N word lines.

In some implementations, each one of the plurality of SRAMs includes a pair of cross-coupled inverters and a pair of pass-gate transistors configured to allow the pair of cross-coupled inverters to be accessible by each two of the N word lines.

In some implementations, N is 2.

According to another aspect of the present disclosure, a memory device includes a bit line, a plurality of memory cells coupled with the bit line, each one of the plurality of memory cells includes a common phase-change memory (PCM) element and two selectors coupled with the common PCM element, and two word lines. Each one of the two word lines is coupled with each one of the two selectors.

In some implementations, the memory device further includes a common top electrode formed on the common PCM element.

According to still another aspect of the present disclosure, a system includes a memory device and a memory controller. The memory device includes a bit line, a plurality of memory cells coupled with the bit line, each one of the plurality of memory cells includes N phase-change memory (PCM) elements, and N selectors, where N is a positive integer greater than 1. Each of the N selectors is coupled with a respective one of the N PCM elements and N word lines. Each one of the N word lines is coupled with a respective one of the N selectors. The memory controller is coupled to the memory device and configured to control the plurality of memory cells through the bit line and the N word lines.

In some implementations, the system further includes a plurality of comparator circuits. Each one of the plurality of comparator circuits is coupled with each one of the N word lines such that each one of the plurality of comparator circuits is configured to compare each two of N signals received from each two of the N word lines and output a bit for each comparing result. The plurality of comparator circuits is included in the memory device or the memory controller.

In some implementations, each one of the N signals includes a voltage signal, and each one of the plurality of comparator circuits includes an operational amplifier (op-amp) comparator circuit or a voltage comparator circuit.

In some implementations, the NPCM elements form a common PCM element.

In some implementations, the memory device of the system further includes a plurality of top electrodes, and a plurality of bottom electrodes. Each one of the plurality of top electrodes is formed between the bit line and the respective one of the N PCM elements. Each one of the plurality of bottom electrodes is formed between the respective one of the N word lines and the respective one of the N selectors.

In some implementations, the memory device of the system further includes a plurality of static random-access memories (SRAMs). Each one of the plurality of SRAMs is coupled between each two of the N word lines.

In some implementations, each one of the plurality of SRAMs includes a pair of cross-coupled inverters and a pair of pass-gate transistors configured to control the pair of cross-coupled inverters to be accessible by each two of the N word lines.

In some implementations, each pair of cross-coupled inverters is configured to store a voltage difference between the respective two of the N word lines, such that the plurality of SRAMs is configured to store the voltage differences between every two of the N word lines.

According to yet still another aspect of the present disclosure, a method of operating a memory device is disclosed. The memory device includes a plurality of memory cells, and N word lines. Each one of the memory cells includes N phase-change memory (PCM) elements, and N selectors, where N is a positive integer greater than 1. Each one of the N selectors is coupled with a respective one of the N PCM elements. Each one of the N word lines is coupled with a respective one of the N selectors. The method includes inputting data into each one of the plurality of memory cells to generate N signals from the N word lines; and before the N signals stabilize, comparing each two of the N signals read from the N word lines to output a bit of a comparing result.

In some implementations, each one of the N signals includes a voltage signal.

In some implementations, the memory device further includes a plurality of comparator circuits. Each two of the N signals read from the N word lines includes a first input signal and a second input signal. The method further includes in response to that the first input signal is greater than the second input signal, outputting the bit as 1, and in response to that the first input signal is less than the second input signal, outputting the bit as 0.

In some implementations, N is 2, and the N PCM elements include a first PCM element and a second PCM element. The first PCM element is programmed as 1 and the second PCM element is programmed as 0.

In some implementations, each one of the plurality of SRAMs includes a pair of cross-coupled inverters, and storing each voltage difference includes storing the voltage difference between respective two of the N word lines in the respective pair of cross-coupled inverters.

According to yet still another aspect of the present disclosure, a method of operating a memory device is disclosed. The memory device includes a plurality of memory cells, and first word line and second word line. Each one of the plurality of memory cells includes a first phase-change memory (PCM) element, a second PCM element, a first selector, and a second selector. The first selector and the second selector are coupled with a first PCM element and a second PCM element, respectively. The first word line and the second word line are coupled with the first selector and the second selector, respectively. The method includes programming the first selector as 0 and the second selector as 1, reading the first PCM element and the second PCM element to generate a first voltage difference of the first PCM element and the second PCM element, programming the first selector as 1 and the second selector as 0, reading the first PCM element and the second PCM element to generate a second voltage difference of the first PCM element and the second PCM element, in response to determining that the first voltage difference and the second voltage difference are same as positive or negative, determining that at least one of the first PCM element and the second PCM element is failed, and in response to determining that the first voltage difference and the second voltage difference are different as positive or negative, determining that one of the first PCM element and the second PCM element is well-functioned.

In some implementations, reading the first PCM element and the second PCM element includes generating a first readout signal and a second readout signal, and the reading is complete before the first readout signal and the second readout signal stabilize.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
 a bit line;
 a plurality of memory cells coupled with the bit line, each one of the plurality of memory cells comprising N phase-change memory (PCM) elements, and N selectors, where N is a positive integer greater than 1, wherein each one of the N selectors is coupled with a respective one of the N PCM elements;
 N word lines, wherein each one of the N word lines is coupled with a respective one of the N selectors; and
 a plurality of comparator circuits, wherein each one of the plurality of comparator circuit is coupled with two of the N word lines such that each one of the plurality of comparator circuit is configured to compare every two of N signals received from the N word lines and output a bit for each comparing result, and wherein each one of the plurality of memory cells stores a number of bits corresponding to a number of the comparing result.

2. The memory device of claim 1, wherein each one of the N signals comprises a voltage signal, and each one of the plurality of comparator circuits comprises an operational amplifier (op-amp) comparator circuit or a voltage comparator circuit.

3. The memory device of claim 1, further comprising:
 a plurality of top electrodes formed on the respective N PCM element.

4. The memory device of claim 3, wherein each one of the plurality of top electrodes is formed between the bit line and the respective one of the N PCM elements, and
 a plurality of bottom electrodes, wherein each one of the plurality of bottom electrodes is formed between the respective one of the N word lines and the respective one of the N selectors.

5. The memory device of claim 1, further comprising:
a plurality of static random access memories (SRAMs), wherein each one of the plurality of SRAMs is coupled between each two of the N word lines.

6. The memory device of claim 5, wherein each one of the plurality of SRAMs comprises a pair of cross-coupled inverters and a pair of pass-gate transistors configured to allow the pair of cross-coupled inverters to be accessible by each two of the N word lines.

7. The memory device of claim 1, wherein N is 2.

8. A memory device, comprising:
a bit line;
a plurality of memory cells coupled with the bit line, each one of the plurality of memory cells comprising a common phase-change memory (PCM) element, and two selectors coupled with the common PCM element;
at least two word lines, wherein each one of the at least two word lines is coupled with each one of the two selectors; and
a plurality of comparator circuits, wherein each one of the plurality of comparator circuit is coupled with two of the at least two word lines such that each one of the plurality of comparator circuit is configured to compare every two of at least two signals received from the at least two word lines and output a bit for each comparing result, and wherein each one of the plurality of memory cells stores a number of bits corresponding to a number of the comparing result.

9. The memory device of claim 8, further comprising:
a common top electrode formed on the common PCM element.

10. A system, comprising:
a memory device comprising:
a bit line;
a plurality of memory cells coupled with the bit line, each one of the plurality of memory cells comprising N phase-change memory (PCM) elements, and N selectors, where N is a positive integer greater than 1, wherein each of the N selectors is coupled with a respective one of the N PCM elements;
N word lines, wherein each one of the N word lines is coupled with a respective one of the N selectors; and
a plurality of comparator circuits, wherein each one of the plurality of comparator circuit is coupled with two of the N word lines such that each one of the plurality of comparator circuit is configured to compare every two of N signals received from the N word lines and output a bit for each comparing result, and wherein each one of the plurality of memory cells stores a number of bits corresponding to a number of the comparing result; and
a memory controller coupled to the memory device and configured to control the plurality of memory cells through the bit line and the N word lines.

11. The system of claim 10, wherein each one of the N signals comprises a voltage signal, and each one of the plurality of comparator circuits comprises an operational amplifier (op-amp) comparator circuit or a voltage comparator circuit.

12. The system of claim 10, wherein the N PCM elements form a common PCM element.

13. The system of claim 10, wherein the memory device further comprises:
a plurality of top electrodes, each one of the plurality of top electrodes formed between the bit line and the respective one of the N PCM elements, and
a plurality of bottom electrodes, each one of the plurality of bottom electrodes formed between the respective one of the N word lines and the respective one of the N selectors.

14. The system of claim 10, wherein the memory device further comprises:
a plurality of static random access memories (SRAMs), wherein each one of the plurality of SRAMs is coupled between each two of the N word lines.

15. The system of claim 14, wherein each one of the plurality of SRAMs comprises a pair of cross-coupled inverters and a pair of pass-gate transistors configured to control the pair of cross-coupled inverters to be accessible by each two of the N word lines.

16. The system of claim 15, wherein each pair of cross-coupled inverters is configured to store a voltage difference between the respective two of the N word lines, such that the plurality of SRAMs is configured to store the voltage differences between every two of the N word lines.

17. The memory device of claim 1, wherein the number of bits is N plus the number of the comparing result.

* * * * *